(12) United States Patent
Zhuravleva et al.

(10) Patent No.: US 11,474,264 B2
(45) Date of Patent: Oct. 18, 2022

(54) SELF-ASSEMBLED DIRECTIONALLY SOLIDIFIED EUTECTICS FOR THERMAL NEUTRON DETECTION

(71) Applicant: University of Tennessee Research Foundation, Knoxville, TN (US)

(72) Inventors: Mariya Zhuravleva, Knoxville, TN (US); Yuntao Wu, Knoxville, TN (US); Charles L. Melcher, Oak Ridge, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 0 days.

(21) Appl. No.: 17/187,412

(22) Filed: Feb. 26, 2021

(65) Prior Publication Data

US 2021/0270980 A1   Sep. 2, 2021

Related U.S. Application Data

(60) Provisional application No. 62/982,532, filed on Feb. 27, 2020.

(51) Int. Cl.
| | | |
|---|---|---|
| *G01T 1/20* | (2006.01) | |
| *G01T 1/202* | (2006.01) | |
| *G01T 3/06* | (2006.01) | |
| *C30B 29/12* | (2006.01) | |

(52) U.S. Cl.
CPC .......... *G01T 1/2023* (2013.01); *C30B 29/12* (2013.01); *G01T 3/065* (2013.01)

(58) Field of Classification Search
CPC ........ G01T 1/2023; G01T 3/065; C30B 29/12
See application file for complete search history.

(56) References Cited

U.S. PATENT DOCUMENTS

| | | | |
|---|---|---|---|
| 9,417,343 B1* | 8/2016 | Bhandari | C09K 11/7733 |
| 2016/0280992 A1* | 9/2016 | Kawai | B32B 37/10 |
| 2017/0052265 A1* | 2/2017 | Fukuda | G01T 1/20 |
| 2018/0066185 A1* | 3/2018 | Boatner | C30B 33/02 |

OTHER PUBLICATIONS

Cappella et al., "Performances and potential of a CeCl3 scintillator," Nucl. Instrum. Methods Phys. Res., Sect. A, vol. 618, pp. 168-175 (2010).

Cheng et al., "Self-assembled natLiCl-CeCl3 directionally solidified eutectics for thermal neutron detection," Cryst Eng Comm vol. 22, pp. 3269-3273 (2020).

(Continued)

*Primary Examiner* — Hugh Maupin
(74) *Attorney, Agent, or Firm* — Jenkins, Wilson, Taylor & Hunt, P.A.

(57) ABSTRACT

Eutectic lithium chloride-cerium chloride (LiCl—CeCl$_3$) compositions are described. An exemplary eutectic composition has about 75 mole % LiCl and about 25 mole % CeCl$_3$. The eutectic compositions can have optical and/or scintillation properties. Also described are methods of preparing the eutectic compositions as well as methods of using radiation detectors including the eutectic compositions in the detection of radiation, including thermal neutrons.

17 Claims, 6 Drawing Sheets
(5 of 6 Drawing Sheet(s) Filed in Color)

(56) References Cited

OTHER PUBLICATIONS

Combes et al., "Optical and scintillation properties of pure and Ce3+-doped Cs2LiYCl6 and U3YCl6 : Ce3+ crystals," J. Lumin., vol. 82, pp. 299-305 (1999).
Den et al., "Phase-Separated CsI-NaCl Scintillator With Optical Guiding Function," IEEE Trans. Nucl. Sci., vol. 60, pp. 16-19 (2013).
Iikura et al., "Evaluations of the new LiF-scintillator and optional brightness enhancement films for neutron imaging", Nucl. Instrum. Methods Phys. Res., Sect. A, vol. 651, pp. 100-104 (2011).
Jackson et al., "Lamellar and Rod Eutectic Growth" Trans. Metall. Soc. AIME, vol. 236, pp. 1129-1142 (1966).
Kawaguchi et al., "Fabrication and characterization of large size 6LiF/CaF2:Eu eutectic composites with the ordered lamellar structure," Nucl. Instrum. Methods Phys. Res., Sect. A, vol. 652, pp. 209-211 (2011).
Li et al., "First-principles studies on the electronic and optical properties ofCeCl3and CeBr3," Solid State Commun., vol. 144, pp. 220-224 (2007).
Li, "Refractive index of alkali halides and its wavelength and temperature derivatives," J. Phys. Chem. Ref. Data, vol. 5, pp. 329-528 (1976).
Lukosi et al., "Lithium indium diselenide: A new scintillator for neutron imaging," Nucl. Instrum. Methods Phys. Res., Set. A, vol. 830, pp. 140-149 (2016).
Ohashi et al., "Submicron-diameter phase-separated scintillator fibers for high-resolution X-ray imaging," Appl. Phys. Lett., vol. 102, Article ID 051907 (2013).
Runkle et al., "Securing special nuclear material: Recent advances I neutron detection and their role in nonproliferation", J. Appl. Phys., vol. 108, Article ID 111101 (2010).
Smith et al., "Fast neutron measurements using Cs2LiYCl6:Ce (CLYC) scintillator," Nucl. Instrum. Methods Phys. Res., Sect. A, vol. 784, pp. 162-167 (2015).
Totsuka et al., "Nuclear Instruments and Methods in Physics Research Section A: Accelerators, Spectrometers, Detectors and Associated Equipment," Nucl. Instrum. Methods Phys. Res., Sect. A, vol. 659, pp. 399-402 (2011).
Wiggins et al., "Scintillation propertiesofsemiconducting 6LiInSe2 crystals toionizingradiation," Nucl. Instrum. Methods Phys. Res., Sect. A, vol. 801, pp. 73-77 (2015).
Wu et al., "A novel LiCl—BaCl2:Eu2+ eutectic scintillator for thermal neutron detection," Nucl. Instrum. Methods Phys. Res., Sect. A, vol. 797, pp. 319-323 (2015).
Yanagida et al., "Scintillation properties of LiF—SrF2 and LiF—CaF2 eutectic," J. Lumin., vol. 144, pp. 212-216 (2013).
Yang et al., "Evaluation of a LiI(Eu) neutron detector with coincident double photodiode readout," Nucl. Instrum. Methods Phys. Res., Sect. A, vol. 652, pp. 364-369 (2011).
Yasui et al., "Phase-separated CsI—NaCl scintillator grownby the Czochralski method," J. Cryst. Growth, vol. 399, pp. 7-12 (2014).
Yoshikawa et al., "Growth and characterization of directionally solidified eutectic systems for scintillator applications," J. Cryst. Growth, vol. 498, pp. 170-178 (2018).
Ziegler et al., "SRIM—The stopping and range of ions in matter (2010)," Nucl. Instrum. Methods Phys. Res., Sect. B, vol. 268, pp. 1818-1823 (2010).
Derenzo et al., "X-ray fluorescence measurements of 412 inorganic compounds", presented in part at the Conference Record of the 1991 IEEE Nuclear Science Symposium and Medical Imaging Conference, Santa Fe, NM, USA, Nov. 2-9, 1991.
Liang et al., Rare Earth Soc. (China) vol. 8, pp. 92-93 (1990).
Nishimoto et al., "Crystal growth of LiF/LiYF4 eutectic crystals and their luminescent properties," J. Eur. Ceram. Soc., vol. 34, pp. 2117-2121 (2014).
Van Eijk, "Inorganic Scintillators for Thermal Neutron Detection," IEEE Trans. Nucl. Sci., vol. 59, pp. 2242-2247 (2012).
Yanagida et al., "Eu-doped 6LiF—SrF2 eutectic scintillators for neutron detection," Opt. Mater., vol. 34, pp. 868-871 (2012).
Yanagida et al., "Ce-doped LiF—SrF2 eutectic scintillators for thermal neutron detection produced at different solidification rates," Opt. Mater., vol. 35, pp. 1449-1454 (2013).
Yasui et al., "Development of Phase-Separated Scintillators with Light-Guiding Properties," Adv. Mater., vol. 24, pp. 5464-5469 (2012).

\* cited by examiner

SELF-ASSEMBLED DIRECTIONALLY SOLIDIFIED EUTECTICS FOR THERMAL NEUTRON DETECTION

RELATED APPLICATIONS

The presently disclosed subject matter claims the benefit of U.S. Provisional Patent Application Ser. No. 62/982,532, filed Feb. 27, 2020; the disclosure of which is incorporated herein by reference in its entirety.

PARTIES TO A JOINT RESEARCH AGREEMENT

The subject matter disclosed herein was made by, on behalf of, and/or in connection with one or more of the following parties to a joint research agreement: Siemens Medical Solutions USA, Inc., and The University of Tennessee. The agreement was in effect on and before the effective filing date of the presently disclosed subject matter, and the presently disclosed subject matter was made as a result of activities undertaken within the scope of the agreement.

TECHNICAL FIELD

The presently disclosed subject matter relates to eutectic optical (e.g. scintillator) materials, such as those comprising lithium chloride and cerium chloride and their use in optical and/or radiation detection applications, including in neutron detection applications.

ABBREVIATIONS

°=degree
° C.=degrees Celsius
%=percentage
γ=gamma
$\lambda_{em}$=emission wavelength
$\lambda_{ex}$=excitation wavelength
μm=micrometer
$^6$Li=lithium-6
Ce=cerium
Cl=chloride
cm=centimeter
EDS=energy-dispersive spectroscopy
eV=electronvolt
hr=hour
in=inch
keV=kiloelectronvolt
kV=kilovolt
$^{nat}$Li=naturally enriched lithium
mA=milliampere
MCA=multi-channel amplifier
MeV=megaelectronvolt
mm=millimeter
mol=mole
nm=nanometers
ns=nanoseconds
ph=photon
PL=photoluminescence
PLE=photoluminescence excitation
PMT=photomultiplier tube
RL=radioluminescence
SEM=scanning electron microscopy
W=watt

BACKGROUND

Scintillator materials, which emit light pulses in response to impinging radiation, such as X-rays, gamma rays, and thermal neutron radiation, are used in detectors that have a wide range of applications in medical imaging, particle physics, geological exploration, security and other related areas. Considerations in selecting scintillator materials typically include, but are not limited to, luminosity, decay time, energy resolution, and emission wavelength.

While a variety of scintillator materials have been developed, there is an ongoing need to develop additional scintillator materials with improved properties for particular applications, such as for the detection of neutrons.

SUMMARY

This summary lists several embodiments of the presently disclosed subject matter, and in many cases lists variations and permutations of these embodiments. This summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently disclosed subject matter, whether listed in this summary or not. To avoid excessive repetition, this Summary does not list or suggest all possible combinations of such features.

In some embodiments, the presently disclosed subject matter provides an optical material comprising a eutectic lithium chloride-cerium chloride (LiCl—CeCl$_3$) composition. In some embodiments, the eutectic LiCl—CeCl$_3$ composition comprises about 75 mole % LiCl and about 25 mole % CeCl$_3$.

In some embodiments, the eutectic LiCl—CeCl$_3$ composition comprises a naturally occurring ratio of lithium isotopes. In some embodiments, the eutectic LiCl—CeCl$_3$ composition comprises isotopically enriched lithium, wherein the isotopically enriched lithium is lithium-6 ($^6$Li).

In some embodiments, the eutectic LiCl—CeCl$_3$ composition has a lamellar structure. In some embodiments, phase thicknesses of LiCl and CeCl$_3$ phases in the eutectic LiCl—CeCl$_3$ composition are about 10 millimeters (mm) or less.

In some embodiments, the eutectic LiCl—CeCl$_3$ composition is prepared by the Bridgman method. In some embodiments, the LiCl—CeCl$_3$ composition is prepared using a pulling rate of about 2 millimeters per hour (mm/hr) to about 8 mm/hr.

In some embodiments, the presently disclosed subject matter provides a radiation detector comprising a photon detector and an optical material comprising a eutectic LiCl—CeCl$_3$ composition. In some embodiments, the radiation detector is a medical diagnostic device, a device for oil exploration, or a device for container or baggage scanning.

In some embodiments, the presently disclosed subject matter provides a method of detecting gamma rays, X-rays, cosmic rays and/or particles having an energy of 1 keV or greater, the method comprising using the radiation detector comprising a photon detector and an optical material comprising a eutectic LiCl—CeCl$_3$ composition. In some embodiments, the presently disclosed subject matter provides a method of detecting neutrons, the method comprising using the radiation detector comprising a photon detector and an optical material comprising a eutectic LiCl—CeCl$_3$ composition, optionally wherein the method of detecting neutrons comprises detecting thermal neutrons.

In some embodiments, the presently disclosed subject matter provides a method of preparing an optical material comprising a eutectic LiCl—CeCl$_3$ composition, wherein the method comprises: (a) providing a mixture of CeCl$_3$ and LiCl; (b) sealing the mixture in a sealed container; (c) heating the container in a furnace to a temperature where the mixture forms a melt; and (d) slowly cooling the sealed container. In some embodiments, the mixture of step (a) comprises about 25 mole % CeCl$_3$ and about 75 mole % LiCl. In some embodiments, slowly cooling the sealed container comprises pulling the sealed container through a furnace having a temperature gradient. In some embodiments, the temperature gradient is about 40° C. per centimeter. In some embodiments, the pulling is performed at a rate of about 2 mm/hr to about 8 mm/hr.

Thus, it is an object of the presently disclosed subject matter to provide a LiCl—CeCl$_3$ eutectic optical (e.g., scintillator) material, a radiation detector comprising the eutectic optical material, a method of detecting high energy radiation (e.g., thermal neutrons) using the radiation detector, and to methods of preparing the eutectic optical material.

An object of the presently disclosed subject matter having been stated hereinabove, and which is achieved in whole or in part by the compositions and methods disclosed herein, other objects will become evident as the description proceeds when taken in connection with the accompanying Figures as best described herein below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
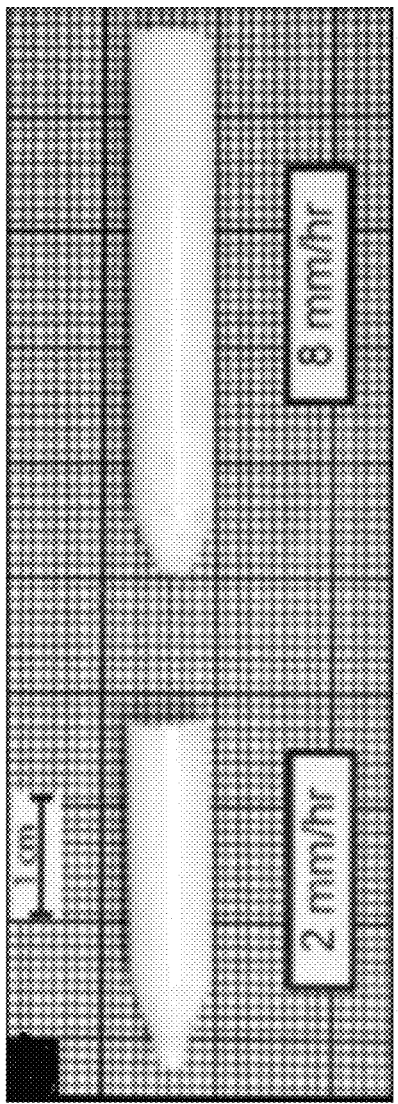
FIG. 1A is a photograph of as-grown ingots of lithium chloride-cerium chloride (LiCl—CeCl$_3$) eutectics grown with a translation speed of 2 millimeter per hour (mm/hr) (left) or 8 mm/hr (right). The scale bar in the upper left represents 1 centimeter.

LiCl—CeCl$_3$ (e.g., $^{nat}$LiCl—CeCl$_3$) eutectic scintillators for thermal neutron detection were synthesized by using the vertical Bridgman method. An exemplary eutectic molar ratio of LiCl and CeCl$_3$ is about 0.75/0.25. The effect of solidification speed on the microstructure, optical properties, and scintillation properties under gamma (γ) and neutron irradiation were studied. As described hereinbelow, the grown exemplary LiCl—CeCl$_3$ eutectics have a lamellar structure. The scintillation emission of exemplary LiCl—CeCl$_3$ eutectics under X-ray excitation peak at 365 nm related to Ce$^{3+}$5d-4f emission and a broad and weak emission at 526 nm. The scintillation decay time of exemplary LiCl—CeCl$_3$ eutectics under gamma (γ) irradiation is about 20 ns. The energy spectra under Pu/Be source irradiation indicates that the synthesized LiCl—CeCl$_3$ is capable of detecting thermal neutron.

The presently disclosed subject matter will now be described more fully. The presently disclosed subject matter can, however, be embodied in different forms and should not be construed as limited to the embodiments set forth herein below and in the accompanying Example. Rather, these embodiments are provided so that this disclosure will be thorough and complete, and will fully convey the scope of the embodiments to those skilled in the art.

All references listed herein, including but not limited to all patents, patent applications and publications thereof, and scientific journal articles, are incorporated herein by reference in their entireties to the extent that they supplement, explain, provide a background for, or teach methodology, techniques, and/or compositions employed herein.

I. Definitions

While the following terms are believed to be well understood by one of ordinary skill in the art, the following definitions are set forth to facilitate explanation of the presently disclosed subject matter.

Unless defined otherwise, all technical and scientific terms used herein have the same meaning as commonly understood to one of ordinary skill in the art to which the presently disclosed subject matter belongs.

Following long-standing patent law convention, the terms "a", "an", and "the" refer to "one or more" when used in this application.

The term "and/or" when used in describing two or more items or conditions, refers to situations where all named items or conditions are present or applicable, or to situations wherein only one (or less than all) of the items or conditions is present or applicable.

The use of the term "or" in the claims is used to mean "and/or" unless explicitly indicated to refer to alternatives only or the alternatives are mutually exclusive, although the disclosure supports a definition that refers to only alternatives and "and/or." As used herein "another" can mean at least a second or more.

The term "comprising", which is synonymous with "including," "containing," or "characterized by" is inclusive or open-ended and does not exclude additional, unrecited elements or method steps. "Comprising" is a term of art used in claim language which means that the named elements are essential, but other elements can be added and still form a construct within the scope of the claim.

As used herein, the phrase "consisting of" excludes any element, step, or ingredient not specified. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed and claimed subject matter can include the use of either of the other two terms.

Unless otherwise indicated, all numbers expressing quantities of time, temperature, light output, atomic (at) or mole (mol) percentage (%), and so forth used herein are to be understood as being modified in all instances by the term "about". Accordingly, unless indicated to the contrary, the numerical parameters set forth in this specification are approximations that can vary depending upon the desired properties sought to be obtained by the presently disclosed subject matter.

As used herein, the term "about", when referring to a value is meant to encompass variations of in one example ±20% or ±10%, in another example ±5%, in another example ±1%, and in still another example ±0.1% from the specified amount, as such variations are appropriate to perform the disclosed methods.

The term "scintillator" refers to a material that emits light (e.g., visible light) in response to stimulation by high energy radiation (e.g., X, α, β, or γ radiation).

The term "phosphor" as used herein refers to a material that emits light (e.g., visible light) in response to irradiation with electromagnetic or particle radiation.

The term "optical material" refers to material that are scintillators and/or phosphors.

The term "high energy radiation" can refer to electromagnetic radiation having energy higher than that of ultraviolet radiation, including, but not limited to X radiation (i.e., X-ray radiation), alpha (α) particles, gamma (γ) radiation, and beta (β) radiation. In some embodiments, the high energy radiation refers to gamma rays, cosmic rays, X-rays, and/or particles (e.g., neutrons) having an energy of 1 keV or greater. Scintillator materials as described herein can be used as components of radiation detectors in apparatuses such as counters, image intensifiers, and computed tomography (CT) scanners.

"Optical coupling" as used herein refers to a physical coupling between a scintillator and a photosensor, e.g., via the presence of optical grease or another optical coupling compound (or index matching compound) that bridges the gap between the scintillator and the photosensor. In addition to optical grease, optical coupling compounds can include, for example, liquids, oils and gels.

"Light output" can refer to the number of light photons produced per unit energy deposited, e.g., by a gamma ray being absorbed, typically the number of light photons per megaelectronvolt (ph/MeV).

As used herein, chemical ions can be represented simply by their chemical element symbols alone (e.g., Li for lithium ion(s) (e.g., $Li^+$) or Ce for cerium ion(s) (e.g., $Ce^{3+}$)).

II. Eutectic $LiCl$—$CeCl_3$ Compositions

Eutectic materials are mixtures of two or more solid phases solidified simultaneously from melts corresponding to eutectic compositions. In a eutectic consisting of two non-identical phases, one solid phase of less molar ratio is normally surrounded by the matrix phase, and typical lamellar and cylindrical structures are formed with a periodic arrangement of two phases. These structures are both shaped because the as grown mixtures tend to minimize the interface between the co-existing phases. The solidification speed (v) and the interphase spacing (λ) of eutectics follow the Hunt-Jackson law, namely $v\lambda^2$=constant.[1] The correlation between microstructure and solidification speed provides an approach to design self-assembled eutectic materials with unique physical properties for structural and functional applications.[2] Eutectic materials can be synthesized from the melt by using the Czochralski,[3] the micro-pulling down,[4,5] and the Bridgman methods.[6-9]

Scintillation materials that can transform high-energy photons or particles into visible or ultraviolet lights have played an important role in the field of radiation detection, such as medical imaging, homeland security, high-energy physics, and industrial inspection. Self-assembled eutectics with tunable microstructures have recently been proposed as potential next-generation X-ray and neutron imaging materials. X-ray and neutron imaging materials can benefit from both high spatial resolution and high detection efficiency. On one hand, halide and oxide eutectics with ordered microstructure, such as $CsI$—$NaCl:Tl^+$ and $GdAlO_3$—$Al_2O_3$:

Ce$^{3+}$,[3,5,10,11] developed for X-ray imaging have shown good optical guide performance due to the total reflection of luminescent light occurring in the fiber or matrix phase depending on their refractive indices. On the other hand, eutectic scintillators have been considered for neutron detection because of the deficit of $^3$He gas,[12] a material often used in neutron detection. For instance, $^6$Li-containing scintillators are promising alternatives to $^3$He gas proportional counters due to the high Q-value of 4.8 MeV of $^6$Li(n,α)$^3$H reaction, including Li-glass,[13] LiF/ZnS ceramics,[14] lithium indium diselenide,[15,16] Cs$_2$LiYCl$_6$:Ce$^{3+}$,[17] LiCaAlF$_6$:Eu$^{2+}$,[18] and LiF:Eu$^{2+}$ crystals.[19] In the past few years, most reported eutectic neutron scintillators have been fluoride-based eutectics involving $^6$Li, such as LiF—SrF$_2$:Ce$^{3+}$,[8] LiF—SrF$_2$:Eu$^{2+}$,[7] LiF—LiYF$_4$,[4] and LiF—CaF$_2$:Eu$^{2+}$.[6] The first chloride-based LiCl—BaCl$_2$:Eu$^{2+}$ eutectic for neutron detection, which has a comparable light yield with that of commercial lithium glass, was described in 2015.[20]

According to one aspect of the presently disclosed subject matter is the development of LiCl—CeCl$_3$ eutectic scintillators, such as 75% LiCl-25% CeCl$_3$,[21] for the detection of thermal neutrons and potentially fast neutrons because of the presence of chlorine. The CeCl$_3$ phase, acting as a spectral transformer, can emit scintillation light peaking at 365 nm under ionizing irradiation and achieve a high light yield of 28,000 photons/MeV.[22] Because the refractive index of CeCl$_3$ is 2.2 at 365 nm,[23] which is higher than that of LiCl$_3$ at 1.67,[24] most of the produced light can propagate in the CeCl$_3$ phase through total internal reflection.

The presently disclosed LiCl—CeCl$_3$ eutectics were grown by the Bridgman method. To understand the effects of solidification speed on the microstructure, optical and scintillation properties of LiCl—CeCl$_3$ eutectics, scanning electron microscopy, energy-dispersive spectroscopy, photoluminescence excitation and emission, X-ray induced radioluminescence, and Pu/Be induced pulse height spectra were used.

In some embodiments, the presently disclosed subject matter provides an optical material (i.e., a phosphor and/or scintillator) comprising a eutectic LiCl—CeCl$_3$ composition. In some embodiments, the eutectic LiCl—CeCl$_3$ composition comprises about 75 mole % LiCl and about 25 mole % CeCl$_3$.

In some embodiments, the eutectic LiCl—CeCl$_3$ composition comprises naturally enriched lithium ($^{nat}$Li), i.e., the composition comprises a naturally occurring ratio of lithium isotopes. Thus, in some embodiments, the Li in the LiCl component of the eutectic composition has a naturally occurring distribution of lithium-6 ($^6$Li) and lithium-7 ($^7$Li) isotopes, i.e., where the Li in the LiCl comprises about 92.5% $^7$Li. In some embodiments, the eutectic composition comprises an isotopically enriched lithium, i.e., where the Li does not have a naturally occurring distribution of lithium isotopes. In some embodiments, the isotopically enriched lithium is $^6$Li, i.e., and the LiCl component comprises Li with a higher than naturally occurring ratio of $^6$Li to $^7$Li. The presence of $^6$Li can enhance neutron detection.

In some embodiments, the eutectic LiCl—CeCl$_3$ composition can comprise two non-identical solid phases (a LiCl phase and a CeCl$_3$ phase) having a cylindrical or lamellar structure. In some embodiments, the composition has a lamellar structure. The phase thicknesses and/or uniformity of the LiCl and CeCl$_3$ phases can be varied, in some embodiments, depending upon synthesis conditions, e.g., pulling rate during synthesis of the eutectic composition via the Bridgman technique. For example, a more rapid pulling rate can result in thinner and/or more phase thickness. In some embodiments, the thickness and/or uniformity of the structure can affect light transport efficiency in the material. In some embodiments, the phase thicknesses of the LiCl and CeCl$_3$ phases can be about 10 mm or less. In some embodiments the phase thicknesses can be about 1 mm to about 10 mm (e.g., about 1, 2, 3, 4, 5, 6, 7, 8, 9, or about 10 mm). In some embodiments, the phase thicknesses can be about 5 to about 10 mm.

As described further hereinbelow, in some embodiments, the eutectic LiCl—CeCl$_3$ composition is prepared by the Bridgman method. In some embodiments, the pulling rate used during preparation of the composition is about 2 millimeters per hour (mm/hr) to about 8 mm/hr (e.g., about 2, 3, 4, 5, 6, 7, or about 8 mm/hr).

III. Radiation Detectors, Related Devices and Methods

In some embodiments, the presently disclosed subject matter provides a radiation detector comprising a scintillator material comprising, consisting essentially of, or consisting of a eutectic LiCl—CeCl$_3$ composition. The radiation detector can comprise the scintillator material (which absorbs radiation and emits light) and a photodetector (which detects said emitted light). The photodetector can be any suitable detector or detectors and can be or not be optically coupled to the scintillator material for producing an electrical signal in response to emission of light from the scintillator material. Thus, the photodetector can be configured to convert photons to an electrical signal. For example, a signal amplifier can be provided to convert an output signal from a photodiode into a voltage signal. The signal amplifier can also be designed to amplify the voltage signal. Electronics associated with the photodetector can be used to shape and digitize the electronic signal.

Figure 5:
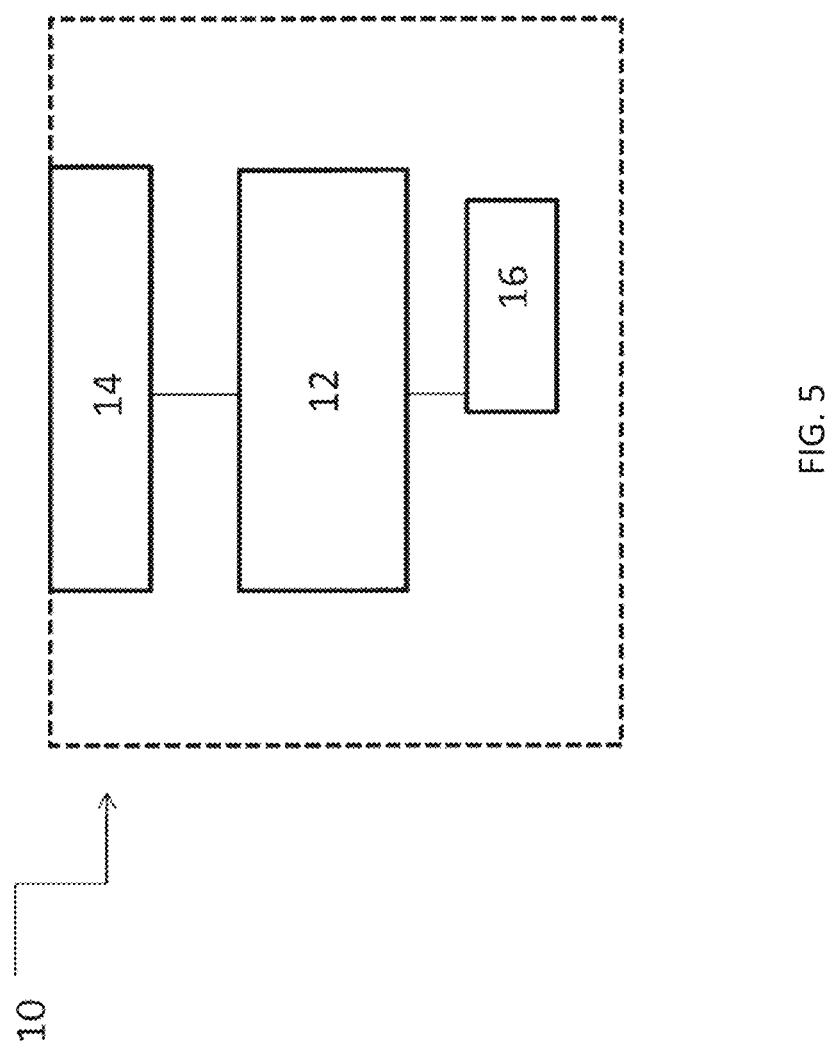
FIG. 5 is a schematic drawing of an apparatus for detecting radiation according to an aspect of the presently disclosed subject matter. Apparatus 10 includes photon detector 12 optically coupled to scintillator material 14. Apparatus 10 can optionally include electronics 16 for recording and/or displaying electronic signal from photon detector 12. Thus, optional electronics 16 can be in electronic communication with photon detector 12.

Referring now to FIG. 5, in some embodiments, the presently disclosed subject matter provides an apparatus 10 for detecting radiation wherein the apparatus comprises a photon detector 12 and a scintillator material 14 (e.g., a eutectic LiCl—CeCl$_3$ composition such as 75 mole % LiCl and 25 mole % CeCl$_3$). Scintillator material 14 can convert radiation to light that can be collected by a charge-coupled device (CCD) or a photomultiplier tube (PMT) or other photon detector 12 efficiently and at a fast rate.

Referring again to FIG. 5, photon detector 12 can be any suitable detector or detectors and can be optically coupled (e.g., via optical grease or another optical coupling compound, such as an optical coupling oil or liquid) to the scintillator (e.g., a eutectic LiCl—CeCl$_3$ scintillator material) for producing an electrical signal in response to emission of light from the scintillator. Thus, photon detector 12 can be configured to convert photons to an electrical signal. Electronics associated with photon detector 12 can be used to shape and digitize the electronic signal. Suitable photon detectors 12 include, but are not limited to, photomultiplier tubes, photodiodes, CCD sensors, and image intensifiers. Apparatus 10 can also include electronics 16 for recording and/or displaying the electronic signal.

In some embodiments, the radiation detector is configured for use as part of a medical or veterinary diagnostic device, a device for oil or other geological exploration (e.g., oil well logging probes), a device or instrument for surveying or as a device for security and/or military-related purposes (e.g., as a device for container, vehicle, or baggage scanning or for scanning humans or other animals). In some embodiments, the medical or veterinary diagnostic device is selected from, but not limited to, a positron emission tomography (PET)

device, an X-ray computed tomography (CT) device, a single photon emission computed tomography (SPECT) device, or a planar nuclear medical imaging device. For example, the radiation detector can be configured to move (e.g., via mechanical and/or electronic controls) over and/or around a sample, such as a human or animal subject, such that it can detect radiation emitted from any desired site or sites on the sample. In some embodiments, the detector can be set or mounted on a rotating body to rotate the detector around a sample.

In some embodiments, the device can also include a radiation source. For instance, an X-ray CT device of the presently disclosed subject matter can include an X-ray source for radiating X-rays and a detector for detecting said X-rays. In some embodiments, the device can comprise a plurality of radiation detectors. The plurality of radiation detectors can be arranged, for example, in a cylindrical or other desired shape, for detecting radiation emitted from various positions on the surface of a sample.

In some embodiments, the presently disclosed subject matter provides a method for detecting radiation (or the absence of radiation) using a radiation detector comprising a scintillator material comprising, consisting essentially of, or consisting of a eutectic $LiCl$—$CeCl_3$ composition as described hereinabove (e.g., a eutectic composition comprising about 75 mole % LiCl and about 25 mole % $CeCl_3$). Thus, in some embodiments, the presently disclosed subject matter provides a method of detecting gamma rays, X-rays, cosmic rays and particles having an energy of 1 keV or greater, wherein the method comprises using a radiation detector comprising a scintillator material comprising, consisting essentially of, or consisting of a eutectic $LiCl$—$CeCl_3$ composition as described hereinabove (e.g., a eutectic composition comprising about 75 mole % LiCl and about 25 mole % $CeCl_3$). In some embodiments, the scintillator material comprises $^{nat}Li$. In some embodiments, the scintillator material comprises an isotopically enriched Li, e.g, $^6Li$. In some embodiments, the scintillator material comprises a lamellar structure, e.g., having phase thicknesses of about 10 mm or less (e.g., about 5 mm to about 10 mm).

In some embodiments, the presently disclosed subject matter provides a method for detecting neutrons (e.g., thermal neutrons) using a radiation detector comprising a scintillation material comprising, consisting essentially of, or consisting of a eutectic $LiCl$—$CeCl_3$ composition as described hereinabove (e.g., a eutectic composition comprising about 75 mole % LiCl and about 25 mole % $CeCl_3$). Radiation detectors that can detect neutrons can be used, for example, to measure power in nuclear or research reactors; as research instruments in the fields of materials science, plasma physics, and particle physics; and to detect cosmic rays and/or special nuclear materials. In some embodiments, the radiation detector can be a medical diagnostic device, a device for oil exploration, a surveying device, or a device for container or baggage scanning. In some embodiments, the radiation detector can be a scientific research device.

In some embodiments, the presently disclosed methods can comprise providing a radiation detector comprising a photodetector and a scintillator material comprising, consisting essentially of, or consisting of a eutectic composition of the presently disclosed subject matter; positioning the detector, wherein the positioning comprises placing the detector in a location wherein the scintillator material is in the path of a beam of radiation (or the suspected path of a beam of radiation); and detecting light (or detecting the absence of light) emitted by the scintillator material with the photodetector. Detecting the light emitted by the scintillator material can comprise converting photons to an electrical signal. Detecting can also comprise processing the electrical signal to shape, digitize, or amplify the signal. The method can further comprise displaying the electrical signal or processed electrical signal.

IV. Methods of Preparation

The presently disclosed eutectic compositions can be prepared via any suitable method as would be apparent to one of ordinary skill in the art upon a review of the instant disclosure. In some embodiments, the method comprises preparing a crystal (e.g., a single crystal) from a melt (i.e., a mixture of molten raw materials). For instance, in some embodiments, the composition can be prepared by the Bridgman method (e.g., the vertical Bridgman or Bridgman-Stockbarger method), wherein a crucible or ampoule containing a melt of the molten raw materials is pulled through a temperature gradient in a furnace from a warmer region of the furnace to a cooler region, causing the molten raw materials to slowly cool and a crystal or crystals to form. Alternative methods for producing the presently disclosed compositions include, but are not limited to the micro-pulling down method, the Czochralski (pulling-up) method, zone melt method, Edge-defined Film-fed Growth (EFG) method, and hot isostatic press (HIP) sintering method.

The raw materials (i.e., "starting materials") for the composition comprise $CeCl_3$ and LiCl. In some embodiments, the starting materials include $^6Li$ enriched LiCl. When the composition is used as a crystal for a scintillator, a high-purity raw material (e.g., having a purity of 99.99% or higher and/or not containing more than 1 ppm of an impurity) can be used. These starting materials can be weighed and mixed such that a desired composition is obtained at the time of forming a melt.

In some embodiments, the raw materials can be measured out and mixed, e.g., using a ball mill, etc., and the mixed powder heated to a temperature above the melting temperature of the raw material with the highest melting temperature (e.g., above the 817° C. melting temperature of $CeCl_3$) to provide a homogenous mixture of raw materials and cooled.

In some embodiments, the method further comprises annealing the scintillator material for a period of time (e.g., between a few hours and a few days). The annealing can be performed, for example, under vacuum, in nitrogen, or a mixture of nitrogen and hydrogen. The annealing can be done at any suitable temperature that is lower than the melting point of the material, e.g., between about 100 and about 450 degrees Celsius (e.g., about 100, 150, 200, 250, 300, 350, 400, or about 450 degrees Celsius). In some embodiments, the annealing increases the light yield of the material and/or provides a material with a faster scintillation decay time. In some embodiments, the annealing is performed under vacuum.

In some embodiments, the presently disclosed subject matter provides a method of preparing an optical material (i.e., a scintillator and/or phosphor) comprising, consisting essentially of, or consisting of a eutectic $LiCl$—$CeCl_3$ material. In some embodiments, the method comprises: (a) providing a mixture of $CeCl_3$ and LiCl; (b) sealing the mixture in a sealed container (e.g., an ampoule or crucible); (c) heating the container in a furnace to a temperature where the mixture forms a melt (e.g., to approximately 820° C.-850° C.); and (d) slowly cooling the sealed container. In some embodiments, mixture of step (a) comprises about 25 mole % $CeCl_3$ and about 75 mole % LiCl.

In some embodiments, sealing the mixture is dried for a period of time prior to step (b) or step (c), e.g., under elevated temperature or reduced pressure.

In some embodiments, slowly cooling the sealed container comprises pulling the sealed container through a furnace having a temperature gradient. In some embodiments, the temperature gradient is about 40° C. per centimeter. In some embodiments, the pulling is performed at a rate of about 2 millimeters per hour (mm/hr) to about 8 mm/hr (e.g., about 2, 3, 4, 5, 6, 7, or about 8 mm/hr).

EXAMPLES

The following examples are included to further illustrate various embodiments of the presently disclosed subject matter. However, those of ordinary skill in the art should, in light of the present disclosure, appreciate that many changes can be made in the specific embodiments which are disclosed and still obtain a like or similar result without departing from the spirit and scope of the presently disclosed subject matter.

Example 1

Preparation of Eutectics

Anhydrous, high-purity beads of (99.99%) $CeCl_3$ and LiCl (Sigma-Aldrich, St. Louis, Mo., United States of America) were used as starting materials. The compositions were mixed according to the stoichiometry of $CeCl_3$—LiCl. The mixtures were then loaded into quartz ampoules. The ampoules were evacuated to $10^{-6}$ mbar and heated to 200° C. and kept there for 10 hours to remove residual water and oxygen impurities. After baking, the ampoules were sealed and transferred to a Bridgman growth furnace. They were passed through a temperature gradient of about 40° C./cm at a pulling rate of 2 mm/hr or 8 mm/hr. Finally, the furnace was cooled to room temperature at 20° C./hr. The diameter of the ingots was 7 mm.

Example 2

Microstructure and Composition Analysis

Scanning electron microscopy tests were performed in a Zeiss-EVO MA15 SEM machine (Carl Zeiss A G, Oberkochen, Germany) working at 20 kV using a secondary electron detector. This machine was equipped with an energy-dispersive X-ray spectroscopy (EDS) detector. EDS maps were acquired at micron-size scale. The elemental analyses of the EDS maps, and quantifications were performed using ESPRIT software (Bruker, Billerica, Mass., United States of America).

Example 3

Optical Property Measurements

Photoluminescence emission (PL) and excitation (PLE) spectra were obtained with a Jobin Yvon Fluorolog-3 spectrofluorometer (Horiba, Kyoto, Japan). The excitation light went through an excitation monochromator with a 1 nm bandpass to ensure monochromaticity. Similarly, the emission monochromator was set at a 1 nm bandpass to select emission light of a specific wavelength. In the case of emission and excitation spectra, a 450 W continuous xenon lamp was used as the excitation source. Photoluminescence decay was measured on the same spectrofluorometer using a time-correlated-single-photon counting module. Jobin Yvon NanoLEDs (pulsed light-emitting diodes; Horiba, Kyoto, Japan) were used as the excitation source. The duration of the light pulse was shorter than 2 ns and therefore was not deconvoluted from the much longer decay profiles.

Example 4

Scintillation Property Measurements

The scintillation decay time was measured using a time-correlated single-photon counting setup under a $^{137}Cs$ gamma-ray source excitation. An X-ray tube operated at 35 kV and 0.1 mA was used as the excitation source for X-ray excited radioluminescence (RL) measurements.

A Pu/Be neutron source located in the center of a 25×45× 30 $in^3$ polyethylene moderator was used for thermal neutron response measurements. Each sample was coupled to a photomultiplier with optical grease. The PMT and scintillator were covered with tin foil and electrical tape to prevent light pollution. The pulse processing chain for the measurement consisted of a H6533 Hamamatsu photomultiplier tube (PMT) assembly (Hamamatsu Photonics K. K., Hamamatsu City, Japan), a CR-113 preamplifier (Cremat Inc., West Newton, Mass., United States of America), a ORTEC 572A amplifier with a 6 ms shaping time (Advanced Measurement Technology, Inc., Oak Ridge, Tenn., United States of America), and an ASPEC927A multi-channel analyzer (MCA; Advanced Measurement Technology, Inc., Oak Ridge, Tenn., United States of America).

Example 5

Discussion of Examples 1-4

Figure 1B:
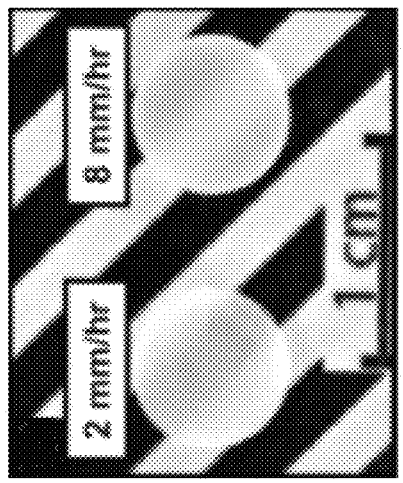
FIG. 1B is a photograph of 7×1 cubic millimeter (mm$^3$) slabs of the ingots shown in FIG. 1A. The slabs were cut perpendicular to the ingot axis. The eutectic grown with a translation speed of 2 millimeter per hour (mm/hr) is on the left and that grown with a translation speed of 8 mm/hr on the right. The scale bar at the bottom represents 1 centimeter.
Figure 2B:
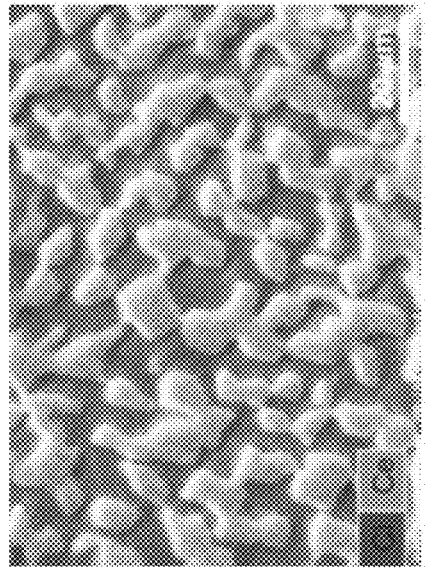
FIG. 2B is an energy-dispersive spectroscopy (EDS) image of the sample shown in FIG. 2A. The scale bar in the lower right represents 20 micrometers (µm).
Figure 2D:
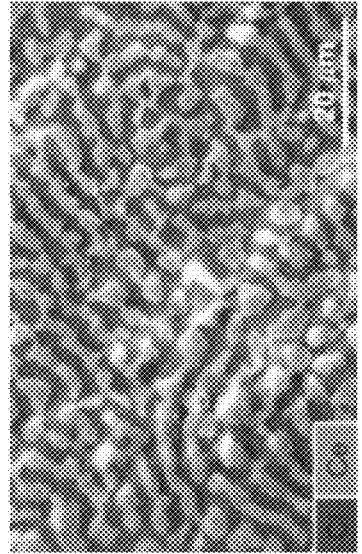
FIG. 2D is an energy-dispersive spectroscopy (EDS) image of the sample shown in FIG. 2C. The scale bar in the lower right represents 20 micrometers (µm).
Figure 2A:
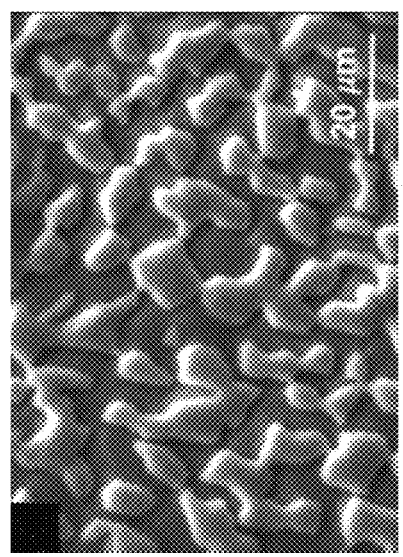
FIG. 2A is a scanning electron microscope (SEM) image of a transaxial cross-section of a lithium chloride-cerium chloride (LiCl—CeCl$_3$) slab grown with a pulling rate of 2 millimeters per hour. The scale bar in the lower right represents 20 micrometers (µm).
Figure 2C:
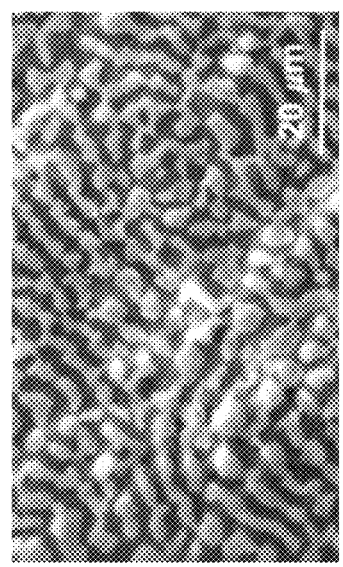
FIG. 2C is a scanning electron microscope (SEM) image of a transaxial cross-section of a lithium chloride-cerium chloride (LiCl—CeCl$_3$) slab grown with a pulling rate of 8 millimeters per hour. The scale bar in the lower right represents 20 micrometers (µm).

The LiCl—$CeCl_3$ eutectics were grown with two different pulling rates of 2 and 8 mm/hr. The as-grown ingots are shown in FIG. 1A. The 1 mm thick slabs shown in FIG. 1B were cut perpendicular to the boule axis. The SEM images of the cross-sections of the LiCl—$CeCl_3$ slabs are shown in FIGS. 2A and 2C. Both eutectics show lamellar-like structure. The black and gray colored regions are associated with the LiCl and $CeCl_3$ phases, respectively. As the increase of pulling rate from 2 to 8 mm/hr, the phase thickness of LiCl and $CeCl_3$ became smaller from roughly 10 to 5 mm. Without being bound to any one theory, it is believed that the phase thickness can influence the ionizing energy deposition and detection spatial resolution. The variation of phase thickness with pulling rate fits the Hunt-Jackson law. The energy-dispersive spectroscopy (EDS) images (FIGS. 2B and 2D) show the distribution of Ce and Cl elements, shown in green and red, respectively, confirming the separation between $CeCl_3$ phases and LiCl phases.

Figure 3B:
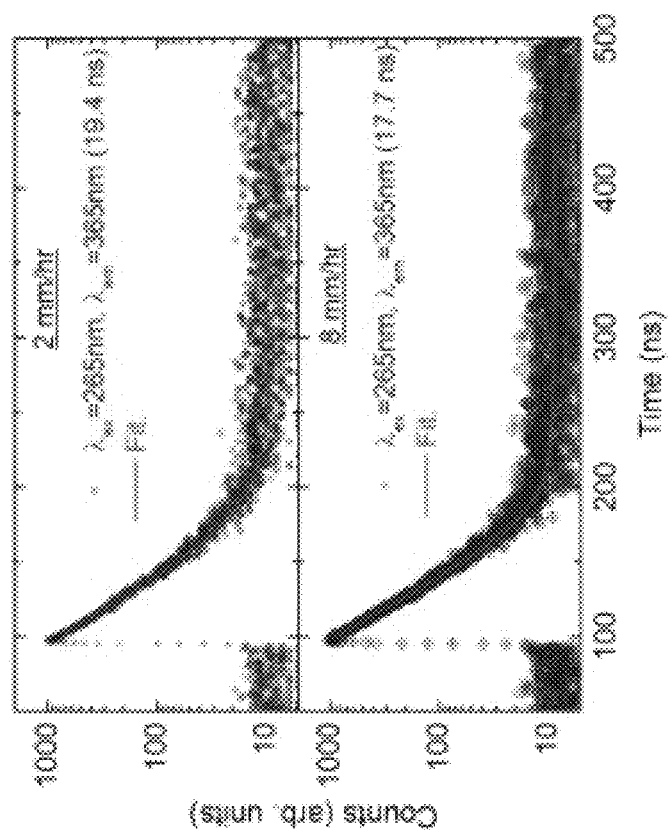
FIG. 3B is a pair of graphs showing the photoluminescence (PL) decay profiles (counts in arbitrary units versus time in nanoseconds (ns)) under 265 nanometer excitation of lithium chloride-cerium chloride (LiCl—CeCl$_3$) eutectics grown with pulling rates of 2 millimeters per hour (mm/hr) (top) and 8 mm/hr (bottom).
Figure 3A:
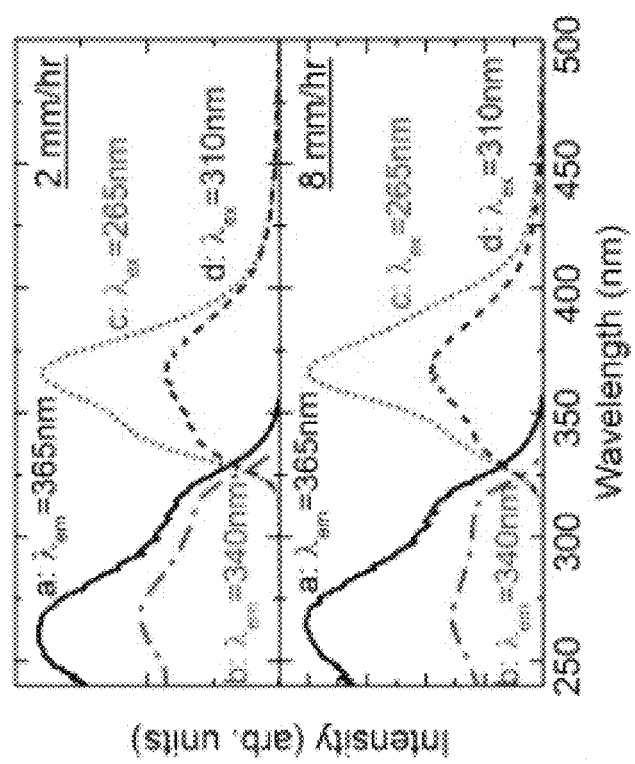
FIG. 3A is a pair of graphs showing the photoluminescence (PL) emission and photoluminescence excitation (PLE) spectra (intensity in arbitrary units versus wavelength in nanometers (nm)) of lithium chloride-cerium chloride (LiCl—CeCl$_3$) eutectics grown with pulling rates of 2 millimeters per hour (mm/hr) (top) and 8 mm/hr (bottom).

Photoluminescence excitation and emission spectra of the LiCl—$CeCl_3$ eutectic samples are shown in FIG. 3A. The observed 340 and 365 nm emission peaks upon 265 nm excitation are ascribed to the $Ce^{3+}$5d-4f emissions. Under 310 nm excitation, the emission peaks are at the same wavelengths but with a lower intensity. When monitoring 340 and 365 nm emissions, two broad excitation bands peaking at 265 and 310 nm are observed. The PL decay profiles of LiCl—$CeCl_3$ eutectics monitoring $\lambda_{ex}=265$ nm and $\lambda_{em}=365$ nm are presented in FIG. 3B. Both decay profiles can be well fit by a single exponential function. The decay time of the sample grown with a pulling rate of 2 mm/hr is 19.4 ns, slightly longer than the 17.7 ns decay time observed for the 8 mm/hr sample.

Figure 3D:
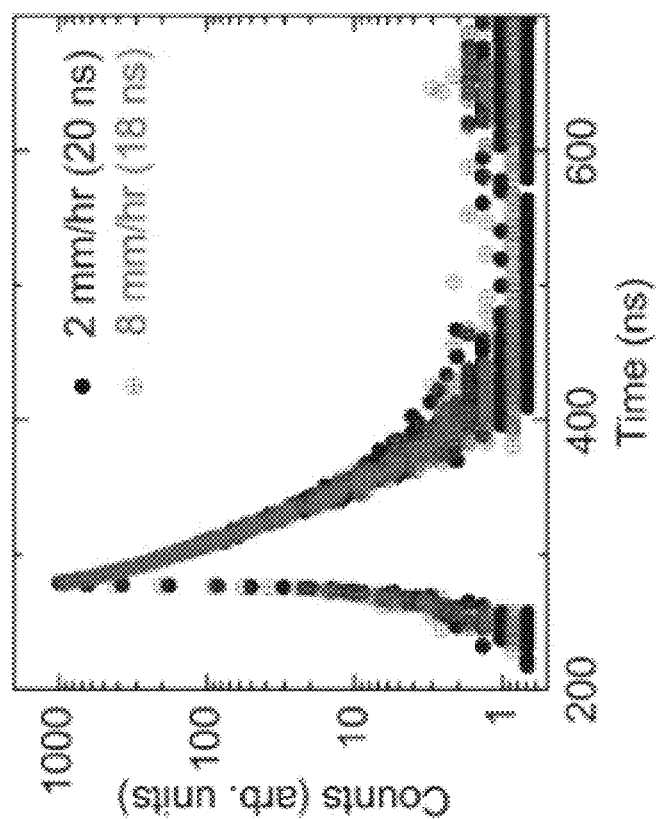
FIG. 3D is a graph showing the scintillation decay profiles (counts in arbitrary units versus time in nanoseconds (ns)) under cesium-137 ($^{137}$Cs) irradiation of lithium chloride-cerium chloride (LiCl—CeCl$_3$) eutectics grown with pulling rates of 2 millimeters per hour (mm/hr) (solid filled circles) and 8 mm/hr (circles filled with "+"s).
Figure 3C:
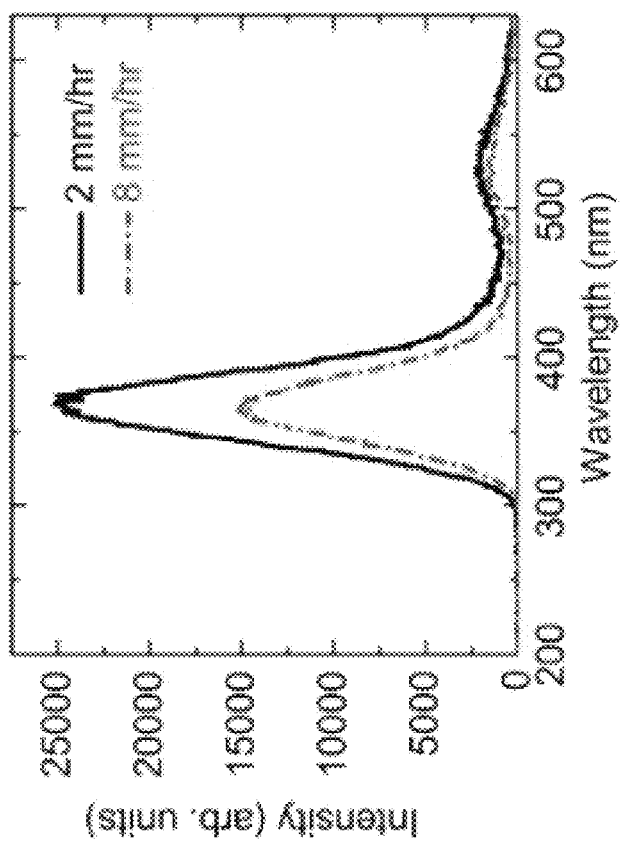
FIG. 3C is a graph showing the X-ray excited radioluminescence (RL) spectra (intensity in arbitrary units versus wavelength in nanometers (nm)) of lithium chloride-cerium chloride (LiCl—CeCl$_3$) eutectics grown with pulling rates of 2 millimeters per hour (mm/hr) (solid line) and 8 mm/hr (dotted line).

The X-ray excited RL spectra are plotted in FIG. 3C. An intense emission peak appears at 365 nm in both samples related to $Ce^{3+}$ 5d-4f emission, consistent with the PL results. For $CeCl_3$ scintillators, the emission peak was reported to be at 360 nm when excited with a 20 keV X-ray.[22] Without being bound to any one theory, the weak emission peak at 526 nm is believed to be related to defect emission, such as oxygen impurities. Scintillation decay profiles under $^{137}Cs$ irradiation are shown in FIG. 3D. The scintillation decay constant is 20.0 ns for the 2 mm/hr sample and 18.0 ns for the 8 mm/hr sample. The less than 1 ns difference between scintillation and PL decay constants suggests an efficient energy transfer from host to activators.

Figure 4A:
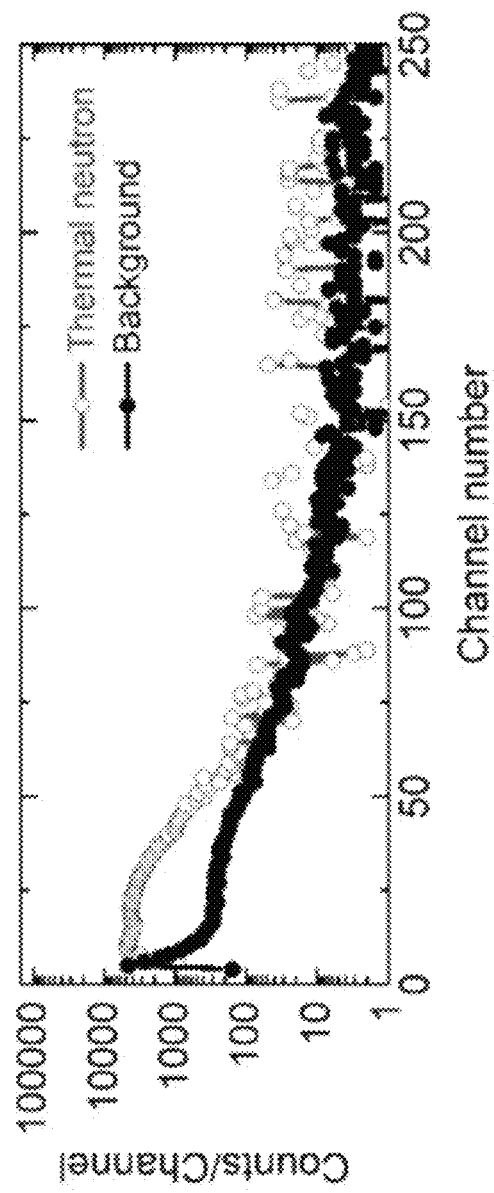
FIG. 4A is a graph of the cadmium(Cd)-covered corrected spectrum (counts per channel versus channel number) collected for the lithium chloride-cerium chloride (LiCl—CeCl$_3$) eutectic scintillator grown with a pulling rate of 2 millimeters per hour under plutonium/beryllium (Pu/Be) neutron source irradiation. Filled circles show background. Unfilled circles show thermal neutron response.
Figure 4B:
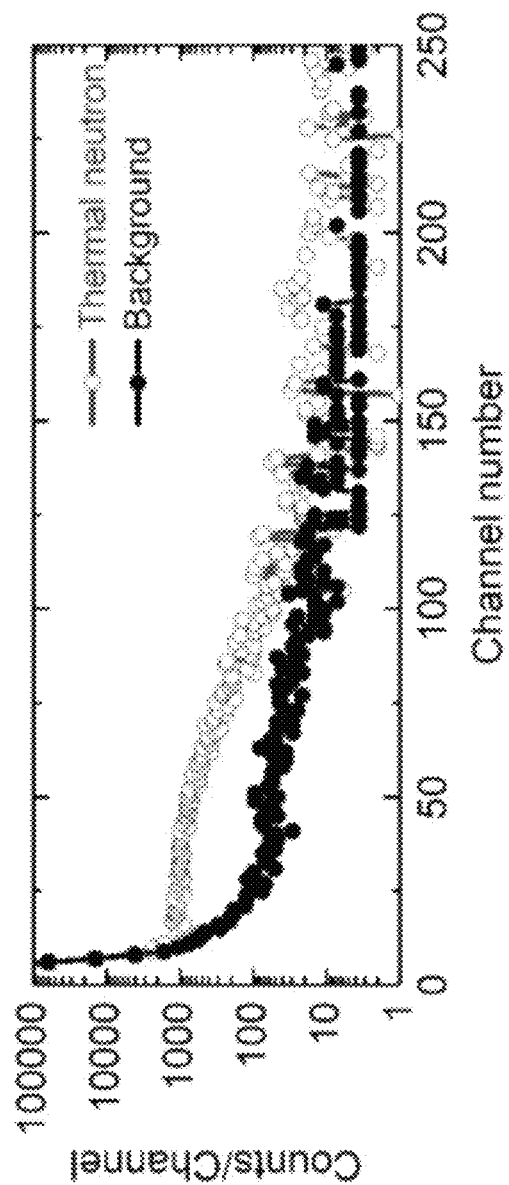
FIG. 4B is a graph of the cadmium(Cd)-covered corrected spectrum (counts per channel versus channel number) collected for the lithium chloride-cerium chloride (LiCl—CeCl$_3$) eutectic scintillator grown with a pulling rate of 8 millimeters per hour under plutonium/beryllium (Pu/Be) neutron source irradiation. Filled circles show background. Unfilled circles show thermal neutron response.

FIGS. 4A and 4B present pulse height spectra of the LiCl—$CeCl_3$ eutectic scintillators recorded under a Pu/Be source irradiation. A thermal neutron response above background was observed in both samples. Using Stopping and Range of Ions in Matter (SRIM) software[25], the calculated range of the 2.73 MeV $^3H$ particle in LiCl ($\rho$=2.07 g/cm$^3$) and $CeCl_3$ ($\rho$=3.97 g/cm$^3$) is 49.8 μm and 38.8 μm, respectively. For the 2.05 MeV $^4He$ particle, the respective ranges are 8.41 μm and 6.55 μm. This gives a combined range of the secondary charged particles from the $^6Li$ neutron absorption in LiCl and $CeCl_3$ of 58.21 μm and 45.35 μm, respectively. Without being bound to any one theory, and referring to FIGS. 2A-2D, it can be inferred that the secondary charged particles can deposit their energy in only a few adjacent $CeCl_3$ regions in the sample grown at 2 mm/hr, pending the angle of emission with respect to the growth direction. For the sample grown at 8 mm/hr, the secondary charged particles appear to more evenly distribute their energy loss across multiple LiCl and $CeCl_3$ regions. While the structures observed in FIGS. 2A-2D do not readily allow a full transport simulation of the secondary charged particles and the relative energy deposition in each material region, it seems reasonable to assume that the fractional energy loss in each region is roughly equal for both samples. However, the lamellar structure of the sample grown at 8 mm/hr appears more uniform, such that its light transport efficiency to the PMT can be higher than the sample grown at 2 mm/hr. This agrees with the slightly higher mean pulse amplitude from thermal neutron exposure observed for the 8 mm/hr sample in FIG. 4B. Still, the pulse amplitude observed in both samples is small given the 4.78 MeV of energy released. First, additional optimization of the growth process can produce a more well-defined, columnar lamella structure to maximize the light transport efficiency to the PMT. Second, it has been experimentally shown that the pulse height deficit between alpha particles and betas in pure $CeCl^3$ scintillators is approximately 0.3,[26] and noting that a significant fraction of energy is lost outside of the $CeCl_3$ region can explain the low pulse height amplitude. Advantageously, pulse shape discrimination is possible with $CeCl_3$, and if contamination in the growth from the actinide decay chains can be minimized, then more effective thermal neutron counting can be possible. Finally, if pulse shape discrimination between $^1H$ and $^3H$ is possible, then it can be possible to count both thermal ($^6Li$ reaction) and fast ($^{35}Cl$ reaction[27]) neutrons while discriminating gamma background.

In summary, a new LiCl—$CeCl_3$ eutectic was successfully prepared by the Bridgman method for thermal neutron detection application for the first time. The LiCl and $CeCl_3$ phases were well separated in the as-synthesized eutectics with a lamellar structure. With the increase of the pulling rate from 2 to 8 mm/hr, the phase thickness decreased from about 10 to 5 μm. The scintillation emission peak at 365 nm originated from $Ce^{3+}$ of 5d-4f de-excitation under X-ray irradiation. There is an efficient energy transfer from $CeCl_3$ host lattice to $Ce^{3+}$ centers. It was shown that, even using naturally enriched lithium as a starting material, $^{nat}LiCl$—$CeCl_3$ eutectics were capable of detecting thermal neutrons. To further enhance the neutron detection efficiency and energy resolution, isotopically enriched lithium can be used as starting materials. In addition, the temperature gradient and pulling rate can be further optimized.

REFERENCES

All references listed in the instant disclosure, including but not limited to all patents, patent applications and publications thereof, scientific journal articles, and database entries are incorporated herein by reference in their entireties to the extent that they supplement, explain, provide a background for, and/or teach methodology, techniques, and/or compositions employed herein. The discussion of the references is intended merely to summarize the assertions made by their authors. No admission is made that any reference (or a portion of any reference) is relevant prior art. Applicants reserve the right to challenge the accuracy and pertinence of any cited reference.

1. K. A. Jackson and J. D. Hunt, *Trans. Metall. Soc. AIME*, 1966, 236, 1129-1142.
2. A. Yoshikawa, K. Kamada, S. Kurosawa, Y. Yokota, A. Yamaji, V. I. Chani, Y. Ohashi and M. Yoshino, *J. Cryst. Growth*, 2018, 498, 170-178.
3. N. Yasui, T. Kobayashi, Y. Ohashi and T. Den, *J. Cryst. Growth*, 2014, 399, 7-12.
4. K. Nishimoto, Y. Yokota, S. Kurosawa, Y. Fujimoto, N. Kawaguchi, K. Fukuda and A. Yoshikawa, *J. Eur. Ceram. Soc.*, 2014, 34, 2117-2121.
5. Y. Ohashi, N. Yasui, Y. Yokota, A. Yoshikawa and T. Den, *Appl. Phys. Lett.*, 2013, 102.
6. N. Kawaguchi, K. Fukuda, T. Yanagida, Y. Fujimoto, Y. Yokota, T. Suyama, K. Watanabe, A. Yamazaki and A. Yoshikawa, *Nucl. Instrum. Methods Phys. Res., Sect. A*, 2011, 652, 209-211.
7. T. Yanagida, K. Fukuda, Y. Fujimoto, N. Kawaguchi, S. Kurosawa, A. Yamazaki, K. Watanabe, Y. Futami, Y. Yokota, J. Pejchal, A. Yoshikawa, A. Uritani and T. Iguchi, *Opt. Mater.*, 2012, 34, 868-871.
8. T. Yanagida, Y. Fujimoto, K. Fukuda, N. Kawaguchi, K. Watanabe, A. Yamazaki, A. Uritani and V. Chani, *Opt. Mater.*, 2013, 35, 1449-1454.
9. T. Yanagida, N. Kawaguchi, Y. Fujimoto, K. Fukuda, K. Watanabe, A. Yamazaki and A. Uritani, *J. Lumin.*, 2013, 144, 212-216.
10. N. Yasui, Y. Ohashi, T. Kobayashi and T. Den, *Adv. Mater.*, 2012, 24, 5464-5469.
11. T. Den, T. Saito, R. Horie, Y. Ohashi and N. Yasui, *IEEE Trans. Nucl. Sci.*, 2013, 60, 16-19.
12. R. C. Runkle, A. Bernstein and P. E. Vanier, *J. Appl. Phys.*, 2010, 108, 111101.
13. C. W. E. Van Eijk, *IEEE Trans. Nucl. Sci.*, 2012, 59, 2242-2247.
14. H. Iikura, N. Tsutsui, T. Nakamura, M. Katagiri, M. Kureta, J. Kubo and M. Matsubayashi, *Nucl. Instrum. Methods Phys. Res., Sect. A*, 2011, 651, 100-104.
15. E. Lukosi, E. Herrera, D. Hamm, K.-M. Lee, B. Wiggins, P. Trtik, D. Penumadu, S. Young, L. Santodonato, H. Bilheux, A. Burger, L. Matei and A. C. Stowe, *Nucl. Instrum. Methods Phys. Res., Sct. A*, 2016, 830, 140-149.

16. B. Wiggins, M. Groza, E. Tupitsyn, E. Lukosi, K. Stassun, A. Burger and A. Stowe, *Nucl. Instrum. Methods Phys. Res., Sect. A,* 2015, 801, 73-77.
17. C. M. Combes, P. Dorenbos, C. W. E. van Eijk, K. W. Kramer and H. U. Gudel, *J. Lumin.,* 1999, 82, 299-305.
18. D. Totsuka, T. Yanagida, K. Fukuda, N. Kawaguchi, Y. Fujimoto, J. Pejchal, Y. Yokota and A. Yoshikawa, *Nucl. Instrum. Methods Phys. Res., Sect. A,* 2011, 659, 399-402.
19. H. Yang, N. Menaa, F. Bronson, M. Kastner, R. Venkataraman and W. F. Mueller, *Nucl. Instrum. Methods Phys. Res., Sect. A,* 2011, 652, 364-369.
20. Y. Wu, E. D. Lukosi, M. Zhuravleva, A. C. Lindsey and C. L. Melcher, *Nucl. Instrum. Methods Phys. Res., Sect. A,* 2015, 797, 319-323.
21. C. Liang, Z. Chaogui, Y. Yupu, *J. Chin. Rare Earth Soc.* (China) 1990, 8, 92-93.
22. S. E. Derenzo, W. W. Moses, J. L. Cahoon, T. A. DeVol and L. Boatner, present in part at the Conference Record of the 1991 IEEE Nuclear Science Symposium and Medical Imaging Conference, Santa Fe, N. Mex., USA, Nov. 2-9, 1991.
23. C. Li, B. Wang, R. Wang and H. Wang, *Solid State Commun.,* 2007, 144, 220-224.
24. H. H. Li, *J. Phys. Chem. Ref. Data,* 1976, 5, 329-528.
25. J. F. Ziegler, M. D. Ziegler and J. P. Biersack, *Nucl. Instrum. Methods Phys. Res., Sect. B,* 2010, 268, 1818-1823.
26. F. Cappella, A. d'Angelo and F. Montecchia, *Nucl. Instrum. Methods Phys. Res., Sect. A,* 2010, 618, 168-175.
27. M. B. Smith, T. Achtzehn, H. R. Andrews, E. T. H. Clifford, P. Forget, J. Glodo, R. Hawrami, H. Ing, P. O'Dougherty, K. S. Shah, U. Shirwadkar, L. Soundara-Pandian and J. Tower, *Nucl. Instrum. Methods Phys. Res., Sect. A,* 2015, 784, 162-167.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. An optical material comprising a eutectic lithium chloride-cerium chloride (LiCl—$CeCl_3$) composition.
2. The optical material of claim 1, wherein the eutectic LiCl—$CeCl_3$ composition comprises about 75 mole % LiCl and about 25 mole % $CeCl_3$.
3. The optical material of claim 1, wherein the eutectic LiCl—$CeCl_3$ composition comprises a naturally occurring ratio of lithium isotopes.
4. The optical material of claim 1, wherein the eutectic LiCl—$CeCl_3$ composition comprises isotopically enriched lithium, wherein the isotopically enriched lithium is lithium-6 ($^6$Li).
5. The optical material of claim 1, wherein the eutectic LiCl—$CeCl_3$ composition has a lamellar structure.
6. The optical material of claim 5, wherein phase thicknesses of LiCl and $CeCl_3$ phases in the eutectic LiCl—$CeCl_3$ composition are about 10 millimeters (mm) or less.
7. The optical material of claim 1, wherein the eutectic LiCl—$CeCl_3$ composition is prepared by the Bridgman method.
8. The optical material of claim 7, wherein the LiCl—$CeCl_3$ composition is prepared using a pulling rate of about 2 millimeters per hour (mm/hr) to about 8 mm/hr.
9. A radiation detector comprising a photon detector and an optical material of claim 1.
10. The radiation detector of claim 9, wherein the radiation detector is a medical diagnostic device, a device for oil exploration, or a device for container or baggage scanning.
11. A method of detecting gamma rays, X-rays, cosmic rays and/or particles having an energy of 1 keV or greater, the method comprising using the radiation detector of claim 9.
12. A method of detecting neutrons, the method comprising using the radiation detector of claim 9, optionally wherein the method of detecting neutrons comprises detecting thermal neutrons.
13. A method of preparing an optical material of claim 1, wherein the method comprises:
   (a) providing a mixture of $CeCl_3$ and LiCl;
   (b) sealing the mixture in a sealed container;
   (c) heating the container in a furnace to a temperature where the mixture forms a melt; and
   (d) slowly cooling the sealed container.
14. The method of claim 13, wherein the mixture of step (a) comprises about 25 mole % $CeCl_3$ and about 75 mole % LiCl.
15. The method of claim 13, wherein slowly cooling the sealed container comprises pulling the sealed container through a furnace having a temperature gradient.
16. The method of claim 15, wherein the temperature gradient is about 40° C. per centimeter.
17. The method of claim 15, wherein the pulling is performed at a rate of about 2 millimeters per hour (mm/hr) to about 8 mm/hr.

* * * * *